United States Patent [19]

Smayling et al.

[11] Patent Number: 4,742,492

[45] Date of Patent: May 3, 1988

[54] EEPROM MEMORY CELL HAVING IMPROVED BREAKDOWN CHARACTERISTICS AND DRIVING CIRCUITRY THEREFOR

[75] Inventors: Michael C. Smayling, Missouri City; Sebastiano D'Arrigo, Houston, both of Tex.

[73] Assignee: Texas Instruments Incorporated, Dallas, Tex.

[21] Appl. No.: 785,309

[22] Filed: Sep. 27, 1985

[51] Int. Cl.[4] .............................................. G11C 13/00

[52] U.S. Cl. .................................... 365/218; 365/185; 307/238.5

[58] Field of Search ....................... 365/185, 104, 218; 307/35.8

[56] References Cited

U.S. PATENT DOCUMENTS

| | | | |
|---|---|---|---|
| 4,004,159 | 1/1977 | Rai et al. | 365/185 |
| 4,203,158 | 5/1980 | Frohman-Bentchkowsky | 365/185 |
| 4,434,478 | 2/1984 | Cook et al. | 365/185 X |
| 4,437,172 | 3/1984 | Masuoka | 365/218 |
| 4,466,081 | 8/1984 | Masuoka | 365/218 X |
| 4,490,900 | 1/1985 | Chiu | 365/185 |
| 4,532,535 | 7/1985 | Gerber et al. | 365/189 |
| 4,558,344 | 12/1985 | Perlegos | 365/185 |
| 4,573,144 | 2/1986 | Countryman, Jr. | 365/185 |
| 4,577,295 | 3/1986 | Eitan et al. | 365/218 |
| 4,589,097 | 5/1986 | Ebihara | 365/185 X |
| 4,601,020 | 7/1986 | Arakawa et al. | 365/185 |
| 4,615,020 | 9/1986 | Rinerson et al. | 365/185 |
| 4,622,737 | 11/1986 | Ravaglia | 365/185 |
| 4,628,487 | 12/1986 | Smayling | 365/185 X |
| 4,630,085 | 12/1986 | Koyama | 365/185 |
| 4,646,265 | 2/1987 | Takamizawa et al. | 365/104 X |
| 4,654,825 | 3/1987 | Rinerson | 365/185 X |

FOREIGN PATENT DOCUMENTS

| | | | |
|---|---|---|---|
| 59-90124 | 5/1984 | Japan | 365/218 |

OTHER PUBLICATIONS

IEEE Journal of Solid-State Circuits, vol. SC-18, No. 5, Oct. 1983, "High Voltage Regulation and Process Considerations for High-Density 5 V—Only E$^2$-PROM's" by Oto et al., pp. 532-534.

*Primary Examiner*—Terrell W. Fears
*Assistant Examiner*—Alfonso Garcia
*Attorney, Agent, or Firm*—John G. Graham; Rodney M. Anderson

[57] ABSTRACT

Erasable programmable memory cell having a control gate, a row line and bit line is disclosed. Line driving circuitry coupled to the bit line and control gate applies a negative voltage to the bit line during the ERASE mode. The latter voltage is such that the voltage across the control gate, floating gate and drain of the floating gate transistor is sufficiently great to cause charging of the floating gate. The construction of the line driving circuit for applying the various voltages, including the negative erase voltage, to the control gate of the floating gate transistor is also disclosed. The line driving circuit is responsive to a control signal indicating the operating mode of the memory, and further includes blocking transistors so that the $V_{pp}$ voltage of the write operation is not coupled back to the circuit input which receives the control signal.

11 Claims, 6 Drawing Sheets

EEPROM MEMORY CELL HAVING IMPROVED BREAKDOWN CHARACTERISTICS AND DRIVING CIRCUITRY THEREFOR

RELATED APPLICATIONS

The present application discloses subject matter which is pertinent to our pending applications Ser. No. 064,416 filed June 18, 1987, and Ser. No. 065,699 filed June 18, 1987, which are a divisional and a continuation, respectively, of application Ser. No. 780,851, filed Sept. 27, 1985, now abandoned.

FIELD

The present invention relates to an erasable electrically programmable memory cell (EEPROM) and its related driving circuitry.

BACKGROUND OF THE INVENTION

Conventional EEPROM's employ 3 to 4 transistors. These include a tunnel diode device coupled to the floating gate of the sense transistor to charge the latter and a select or row transistor to activate the cell. The use of 3 or 4 transistors in a cell clearly limits the size reduction possible for EEPROM arrays. Moreover, since normal operation involves the application of voltages in excess of 15 volts current cells need special processing to reduce leakage and larger layout to avoid unwanted field transistor turn on. A high voltage applied to moats which constitute the sources and drains of the field effect transistors is a particularly serious problem due to the diffused nature of their formation. Diffusion junctions have a lower capacity to withstand high voltages than do other types of junctions. High voltages on such junctions lead to leakage, a need for greater moat-to-moat isolation and to bulk punch through. The row transistor is particularly vulnerable to the latter effects since high voltage is applied to its source during the ERASE mode.

High voltage requirements also obviously require high voltage transistors or level shifters in the column circuitry which are susceptible to a relatively high likelihood of failure. Finally, the presence of high voltages can result in unintended programming or reading of memory cells.

One solution to avoid such problems would be to lower the programming voltage by using thinner tunnel oxide of the order of 70 Angstroms thick. However, this solution would increase leakage thereby decreasing data retention. Coupling efficiency could also be increased but at the expense of area.

It is therefore a principal object of this invention to provide an improved erasable electronically programmable memory cell. Another object is to provide a floating gate EEPROM which has a reduced susceptibility to high voltage breakdown and inadvertent writing on an unselected cell.

SUMMARY OF THE INVENTION

In accordance with the invention there is provided an electrically erasable programmable memory cell having a control gate, a row line and a bit line. Line driving circuitry coupled to the bit line and control gate applied a negative voltage to the bit line during the ERASE mode. The latter voltage is such that the voltage across the control gate, floating gate and drain of the floating gate transistor is sufficiently great to cause charging of the floating gate.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
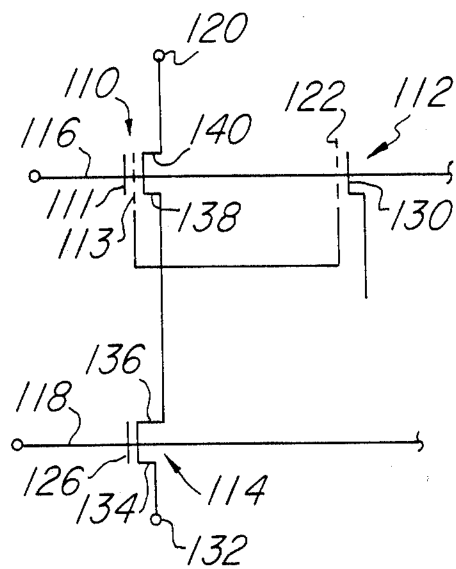
FIG. 1 is a schematic diagram of a 3 transistor EEPROM.

Referring to FIG. 1, there is shown a conventional EEPROM having a floating gate transistor 110 with a floating gate 113 and a control gate 111. A row transistor 114 has its drain 136 connected to a drain 138 of transistor 110 and its source 134 coupled to a read or bit line 132. A tunneling device 112 has an anode 130 coupled to drains 136 and 138 and its cathode 122 to floating gate 113. Control gate 111 connects to a word line 116 while a gate 126 of row transistor 114 connects to a row line 118. The source 140 of transistor 110 couples to a column or "A" line 120.

The conventional voltage levels on the word line, row line, read line and "A" line for the WRITE, ERASE and READ modes are shown in Table 1.

TABLE 1

| | LINES | | | |
|---|---|---|---|---|
| MODE | WORD | ROW | READ | A |
| WRITE | +Vpp | +Vpp | 0 | Float |
| ERASE | 0 | +Vpp | Vpp | Float |
| READ | 2 v | Vdd | Vdd | ov |

The voltage level Vpp corresponds to a high voltage generally in the area of 14–17 volts and Vdd corresponds to a voltage level of about 5 volts. The high voltage Vpp on the read line 132 during erase modes as seen in Table 1 places a large voltage across the diffusion junctions of the source 134 and drain 136 of transistor 114 and limits the size of the cell so as to avoid diode leakage and breakdown. The presence of Vpp on the control gate 111 is not as serious due to the field plate isolation provided by the floating gate 113. Use of a high voltage row transistor is required due to the problem with applying Vpp to the gate 126 of transistor 114.

Voltage levels on the word, row, read and "A" lines according to a preferred embodiment of the invention are shown in Table 2.

TABLE 2

| | LINES | | | |
|---|---|---|---|---|
| MODE | WORD | ROW | READ | A |
| WRITE | +Vpp | +Vdd | 0 | Float |
| ERASE | −12 v | Vdd | Vdd | Float |
| READ | 2 v | Vdd | Vdd | ov |

By applying the voltage levels indicated in Table 2 the problem created by the high voltage application to the read line 132 during the ERASE mode is largely avoided. Although the total voltage difference across control gate 111 and drain 138 is the same as for Table 1, namely Vpp, use of −12 volts on the word line 116 allows the use of only +5 volts on the read line 132 to achieve the same writing voltage. However, having only 5 volts on the read line moat 132 provides less likelihood of source-to-drain leakage or breakdown.

A second problem with using high voltages lies in the possibility of inadvertent writing onto an unselected cell sometimes referred to as 'write disturb'. To exemplify the source of this problem reference may be made to FIG. 2 in which an array of 4 cells is shown. Cells 142 and 144 are coupled to control gate or word line 150 and row line 152. Cells 146 and 148 are coupled to control gate line 156 and row line 154. Cells 142 and 146 are coupled by an "A1" column line 158 and a read or bit line 160. Similarly, cells 144 and 148 are coupled by an "A2" line 162 and a read line 164.

Figure 2:
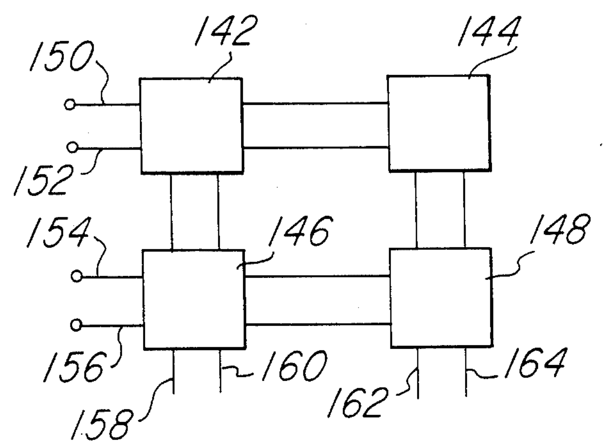
FIG. 2 is a block diagram of a 4 cell array of EEPROMS.

If the voltage levels for the cells of FIG. 2 are set to write to cell 148 they would be those levels shown in Table 3 below.

TABLE 3

| | Voltage Levels For The 4 Cell Array | | | | | | | |
|---|---|---|---|---|---|---|---|---|
| | LINES | | | | | | | |
| MODE | WORD 1 | ROW 1 | READ 1 | A1 | WORD 2 | ROW 2 | READ 2 | A2 |
| WRITE | 0 | 0 | +5 | Float | 17 | 17 | 0 | Float |
| ERASE | 0 | 0 | 0 | Float | −12 | 5 | 5 | Float |
| READ | 0 | 0 | | Float | 2 | 5 | 5 | 0 |

It is observed that there will be a maximum of 12 volts across the tunnel device of unselected cell 146 in the WRITE mode. With an efficiency of 70% the 12 volts leads to 8.4 volts across the tunnel diode. This voltage across the tunnel diode is the same for conventional voltage levels. Since voltages below 8 volts do not lead to "write disturb" events, 8.4 volts leaves only the potential for write disturb and does not create a serious risk of the latter.

Figure 3:
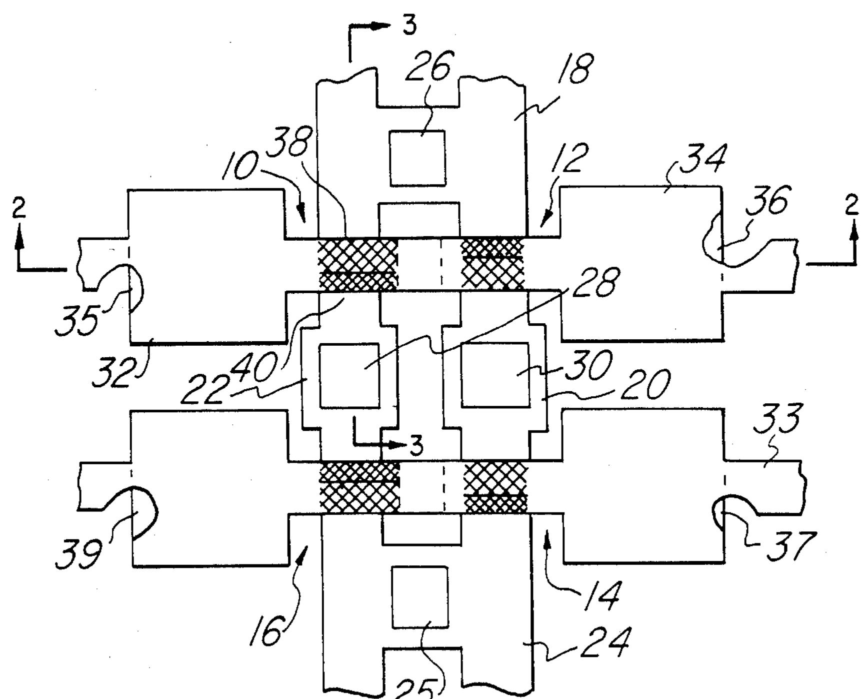
FIG. 3 is a greatly enlarged plan view of four of the memory cells in an array.

A cell structure for which the 12 volts write disturb voltage mentioned above can be reduced is illustrated in FIG. 3. Referring to FIG. 3, there is shown in plan view an array of 4 memory cells 10, 12, 14 and 16 of a preferred chip design of the floating gate type without metal layers. Cells 10 and 12 share a common N+ type source diffusion 18 and cells 14 and 16 share a common N+ type source diffusion 24. Cells 10 and 16 share a common N+ type drain diffusion 22 and cells 12 and 14 share a common N+ type drain diffusion 20. Diffusions 18, 20, 22 and 24 are connected to metal conductors (not shown) via contact areas 26, 28, 30 and 25, respectively. Polysilicon layers 35, 36, 37, and 39 form floating gates for transistors 10, 12, 14 and 16, respectively, while polysilicon layers 34 and 33 form control gates overlying floating gates 35, 36 and 37, 39, respectively, and correspond to the row lines.

Considering transistor 10 as representative example, the source 18 to drain 22 path area has an area 38 used as a floating sense gate and a portion 40 used for electron tunneling.

Figure 4:
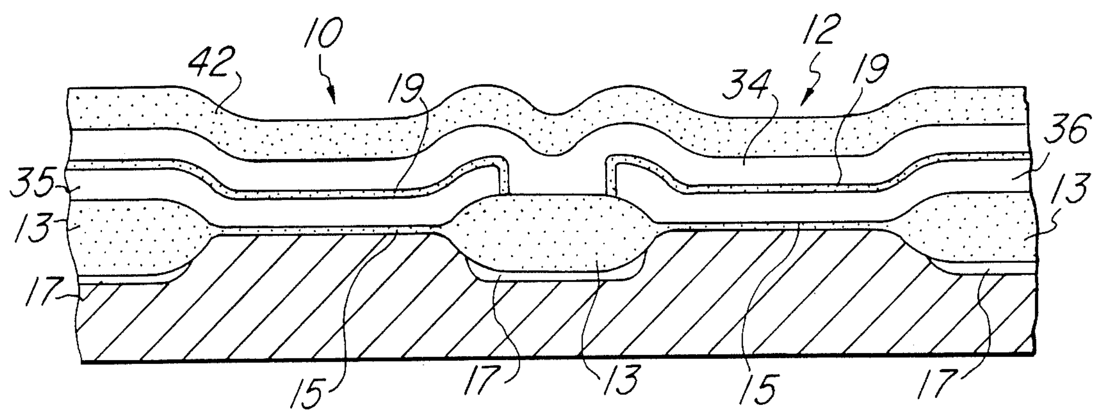
FIGS. 4 and 5 are elevation views in section of the device of FIG. 1 taken along lines 2—2 and 3—3, respectively.

The structure along line 2—2 of FIG. 3 shown in FIG. 4 includes a thin oxide layer 15 of about 100 Angstroms thick under polysilicon floating gates 35 and 37 and layers 19 of interlevel oxide of about 375 Å thickness. A second level of polysilicon 34 forming a row line is deposited and patterned a seen is FIG. 3 over interlevel oxide 19 and in alignment with floating gates 35. The overlap of each floating gate 35 and 36 with the second level of polysilicon 34 extends beyond merely the source to drain path between source 18 and drains 20 and 22 in order to provide a requisite capacitive coupling between the control gate 34 and the floating gate 36. A layer of silicon oxide 42 covers the second level polysilicon 34. Metal contact coupling is made to source 18 on contact area 26 while that to drains 20 and 22 are made on contact areas 30 and 28, respectively, the latter forming bit lines.

Figure 5:
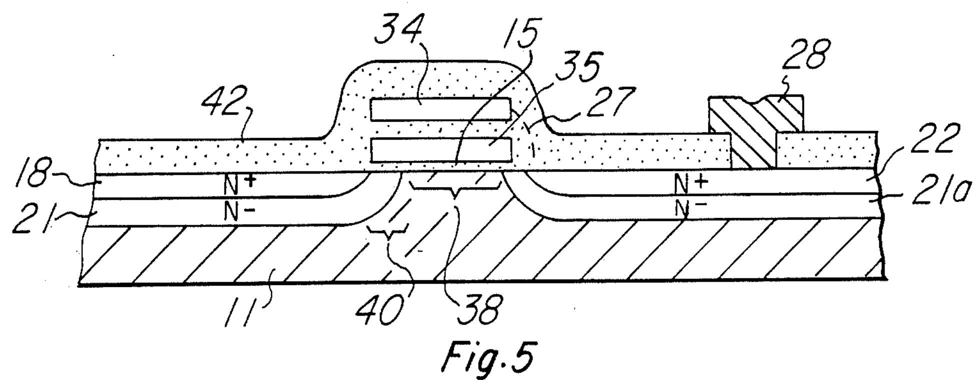

As shown in FIG. 5 taken along line 3—3 of FIG. 3 the substrate 11 has implanted and diffused therein not only N+ type source and drain regions 18 and 20 but also an N− type 'reach-through' layer 21 which emerges at the surface of substrate 11 along one side of floating gate 36 corresponding to area portion 40 of FIG. 3. The width of portion 40 which is a lightly doped N− region is approximately 0.4 micrometers. Typically, the area occupied by portion 40 is 0.375 square micrometers and that of sense gate 38 is approximately 1.875 square micrometers. The area of the floating gate 35 is approximately 22 square micrometers while the area of the field oxide 13 to 19.8 square micrometers. The coupling efficiency for a 100 Å tunnel oxide layer, a 7000 Å field oxide layer and a 375 Å interlevel oxide layer is about 70%. Using 1.5 micrometer square contacts with ½ micrometer registration each cell is approximately 6.0 micrometers long in the row direction and 8.2 microns in the column direction being substantially smaller than either a 3 or 4 transistor EEPROM.

Figure 6:
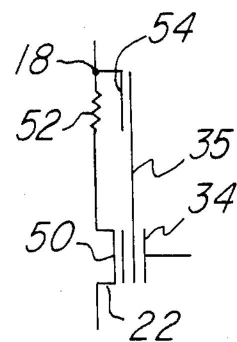
FIG. 6 is an equivalent circuit for a cell of FIG. 1.

The equivalent circuit for the structure of FIG. 5 is shown in FIG. 6 which consists of a drain 20, a floating gate 35, a control gate 34, body resistance 52 of reach-through region 40 and reach-through channel path 40. Tunnel diode 54 of FIG. 6 constitutes reach-through channel path 40 overlapped by floating gate 36 and control gate 34, shown in FIG. 5. With drain 20 floating, source 18 at ground potential and a high voltage (14 volts) Vpp applied to the control gate 34 tunneling of electrons across oxide layer 15 will take place in reach-through channel path region 40 charging the floating gate negatively. The latter corresponds to a WRITE mode. In the ERASE mode drain 20 again floats, source 18 is at about +7 volts and −7 volts is applied to control gate 34 thereby causing electrons to tunnel from floating gate 36 to "reach-through" region 40 and charge the floating gate 36 positively.

In the READ mode the source 18 is precharged to a precharge voltage which is about 5 volts, +2 volts is applied to the row line or control gate 34 if it is to be selected and −2 volts if it is not to be selected. With a negatively charged floating gate 34 no current flows and the precharge voltage remains constant while if the floating gate 34 has been positively charged then current flows from source 18 to drain 20 and the precharge voltage falls.

Utilizing bipolar voltages ensures that the voltage of the moats in an array of such cells never exceeds 7 volts thereby avoiding vulnerability to field breakdown problems in the diffusion formed source and drain junctions. A high voltage on the control gate 34 is not problematic because of the field plate isolation provided by the floating gate 36.

Figure 7:
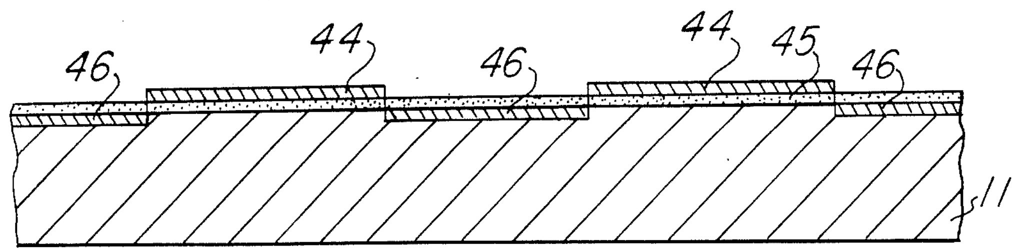
FIGS. 7 through 10 are elevation views in section along line 2—2 of FIG. 3 showing stages in the fabrication of the device.

The process for manufacturing the cells involves first selecting a slice of P-type monocrystalline silicon typically 4 inches in diameter, cut on the [100] plane of a resistivity of about 10 ohm-cm, or, alternately, P− epi on a P+ substrate. In the Figures the portion shown of the bar 11 represents only a very small part of bar or chip, which in turn is a small part of the slice. One slice contains several hundred bars. After cleaning, the slice is oxidized by exposing it to pyrogenic in a furnace it an elevated temperature of 900° C. to produce an oxide layer 15 of a thickness as of about 350 Å over the entire slice. Next a layer 44 of silicon nitride of about 1300 Å thickness is formed over the entire slice by exposing it to an atmosphere of dichlorosilane and ammonia in a reactor. A coating of photoresist is applied to the entire top surface of the slice, then exposed to ultraviolet light through a mask which defines the desired pattern of the thick field oxide 13 and the P+ channel stops 17. The resist is developed, leaving areas where nitride is then removed by etching the exposed part of the nitride layer 44 but leaving in place the oxide layer 15 as seen in FIG. 7.

Using photoresist and nitride as a mask, the slice is subjected to a boron implant to produce the channel stop regions in unmasked regions 46 of the silicon. The regions 46 will not exist in the same form in the finished device, because silicon is consumed in the field oxidation procedure. Usually the slice is subjected to a heat treatment after implant, prior to field oxide growth, as set forth in U.S. Pat. No. 4,055,444, issued to G. R. Mohan Rao, and assigned to Texas Instruments Incorporated.

Figure 8:
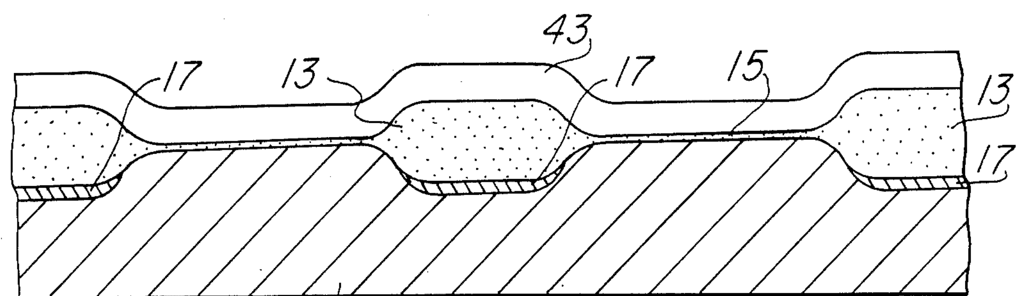
Figure 9:
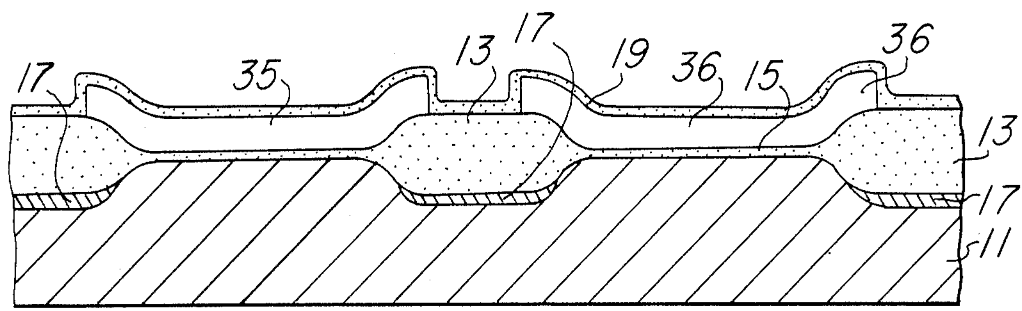

Next field oxide regions 13 are developed by subjecting the slice to steam or an oxidizing atmosphere at about 900° C. or above for perhaps 10 hours or more. This results in thick oxide layers 13 to be grown as seen in FIG. 8 extending into the silicon surface as silicon is consumed with the remaining part of the nitride layer 44 masking oxidation. The thickness of layers 13 is about 7000 Å part of which is above the original surface and part below. The boron doped P+ regions 46 formed by implant are partly consumed, but also diffuse further into the silicon ahead of the oxidation front to produce P+ field stop regions 17 which are much deeper than the original regions 46. Next the remaining nitride layer 44 is removed by etchant which attacks nitride but not silicon oxide, then oxide 15 is removed by etching and the exposed silicon cleaned. The oxide layer 43 is grown by thermal oxidation to a thickness of about 100 Å.

A layer of polycrystalline silicon and/or molybdenum silicide is deposited over the entire slice in a reactor using standard techniques to a thickness of about 5000 Å. The latter layer is patterned by applying a layer of photoresist, exposing the layer of photoresist to ultraviolet light through a mask prepared for this purpose, developing, then etching the exposed polysilicon to define the gate 35.

Figure 10:
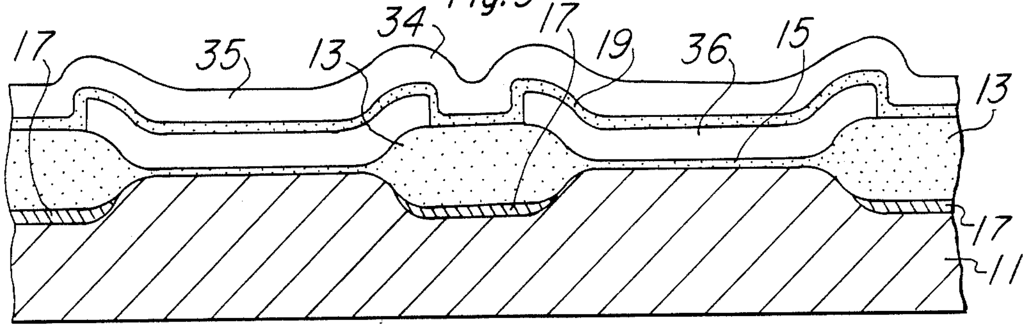

Referring to FIG. 10, next a second level polysilicon 34 is deposited over the entire top surface of the slice including the oxide layer 29 using a reaction as above to provide the control gate for each cell including control gate 34 of cell 12. The second level of polysilicon is patterned using photoresist to define the strips 33 and 34.

Figure 12:
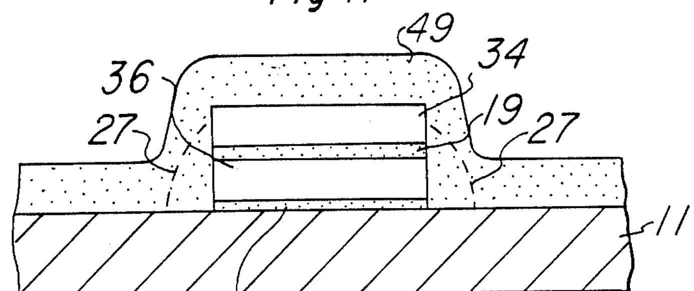
FIGS. 12 through 14 are elevation views in section taken along the line 3—3 of FIG. 3 showing various stages in the fabrication of the device.
Figure 13:
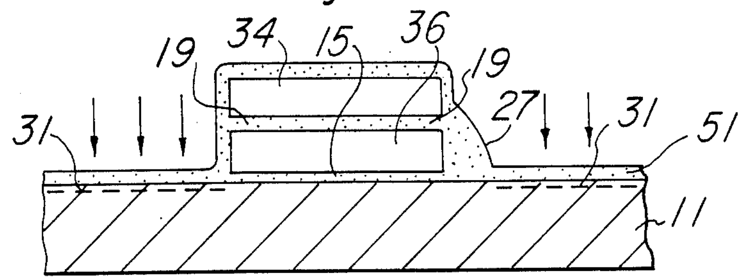
Figure 14:
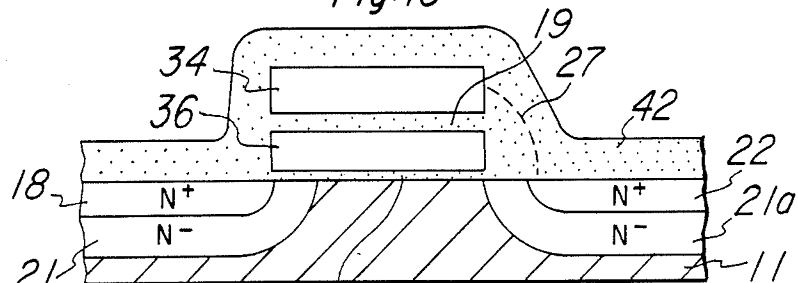

Referring to FIG. 12, a layer of oxide 49 is formed over the face of the slice to ultimately provide the material for the sidewall segments 27. This layer 49 can be of the low-temperature chemical vapor deposition type, for example, as commonly used for multilevel insulators. The layer 49 is subjected to a directional or anisotropic etch using reactive ion etching or a plasma etch as in U.S. Pat. No. 4,297,162, for example, to remove all of the layer 49 on horizontal surfaces and leave the vertically orientated segments like the sidewall segments 27 adhered to the sides of the gate 35 (see FIG. 10). Next, photoresist is applied and exposed to UV light through mask in a region above the sidewall segments 27. The resist is developed and then the sidewall 27 is selectively etched away. As seen in FIG. 14 a thermal oxide 29 is then grown on the exposed silicon or polysilicon surface to a thickness of about 375 Å to avoid outdiffusing of phosphorus and implant damage on the silicon surface.

An arsenic implant is now performed to create the N+ regions 18 and 22 of FIG. 14, using the polysilicon 35 and its underlying oxide 15 along with remaining sidewall oxide 27 as a self-align mask. Then, a phosphorus implant to a dosage of about $8\times10^{13}$ to $2\times10^{14}$ per $cm^3$ is performed. A high temperature of 950° to 1,000° C. anneals implant damage and causes lateral diffusion to create the "reach-through" N− region 21 as well as N+ regions 18 and 22. Region 21 is formed due to the faster diffusion of phosphorus than arsenic through the silicon.

Multilevel oxide layer 42 is then deposited by way of chemical vapor deposition, to insulate the metal layer from the layers of polycrystalline silicon and other areas of the face of the bar.

The multilevel oxide layer 42 is now patterned by a photoresist operation which exposes holes for what will be metal to poly or metal to silicon contacts. Metal contacts and interconnections are made in the usual manner by depositing a thin film of aluminum over the entire top surface of the slice then patterning it by a photoresist mask and etch sequence, leaving the metal contacts or strips and other metal elements. A protective coat is then deposited and patterned to expose the bonding pads (not shown) and the slice is scribed and broken into individual bars which are packaged in the customary manner.

Figure 11:
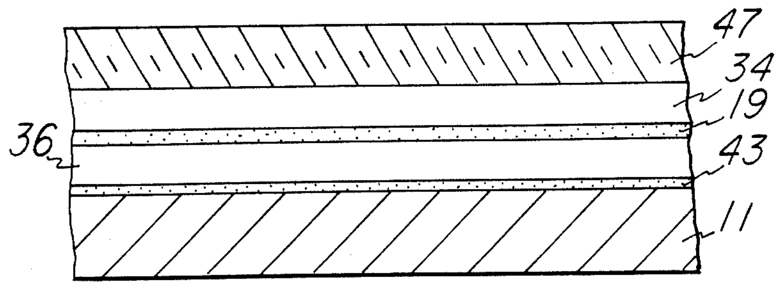
FIG. 11 is an elevation view of the first and second polysilicon layers of the device in an unpatterned area, at a stage in fabrication of the device.

The concept of the invention is also applicable to the p-channel transistors in CMOS devices, using boron for both the heavily doped source 18 and drain 20 and the lightly doped P "reach-through" region 21. First a light-dosage boron implant is performed at the stage of FIG. 11, and a high temperature drive-in to diffuse the boron laterally beneath sidewall segment 27, then subsequently, a heavy-dosage boron implant, with no lengthy high-temperature exposure following it, produces the P+ source 18 and drain 20 regions.

Figure 15:
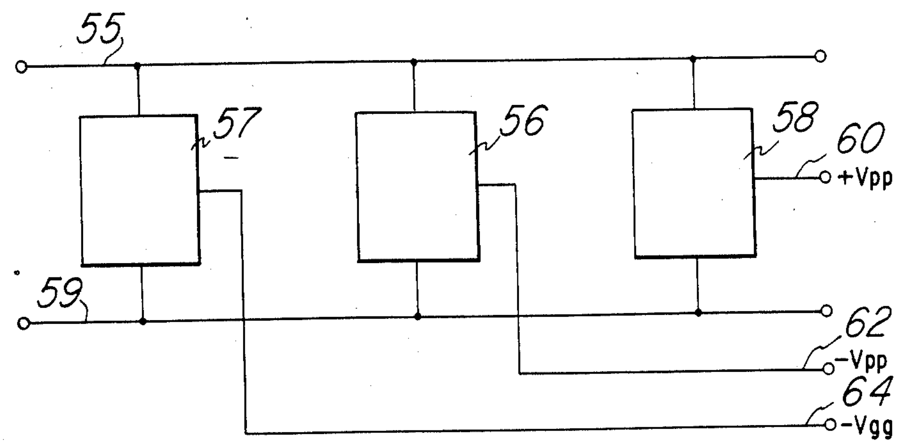
FIG. 15 is a block diagram of the electrical circuit for providing the various voltage levels required by each cell.
Figure 16:
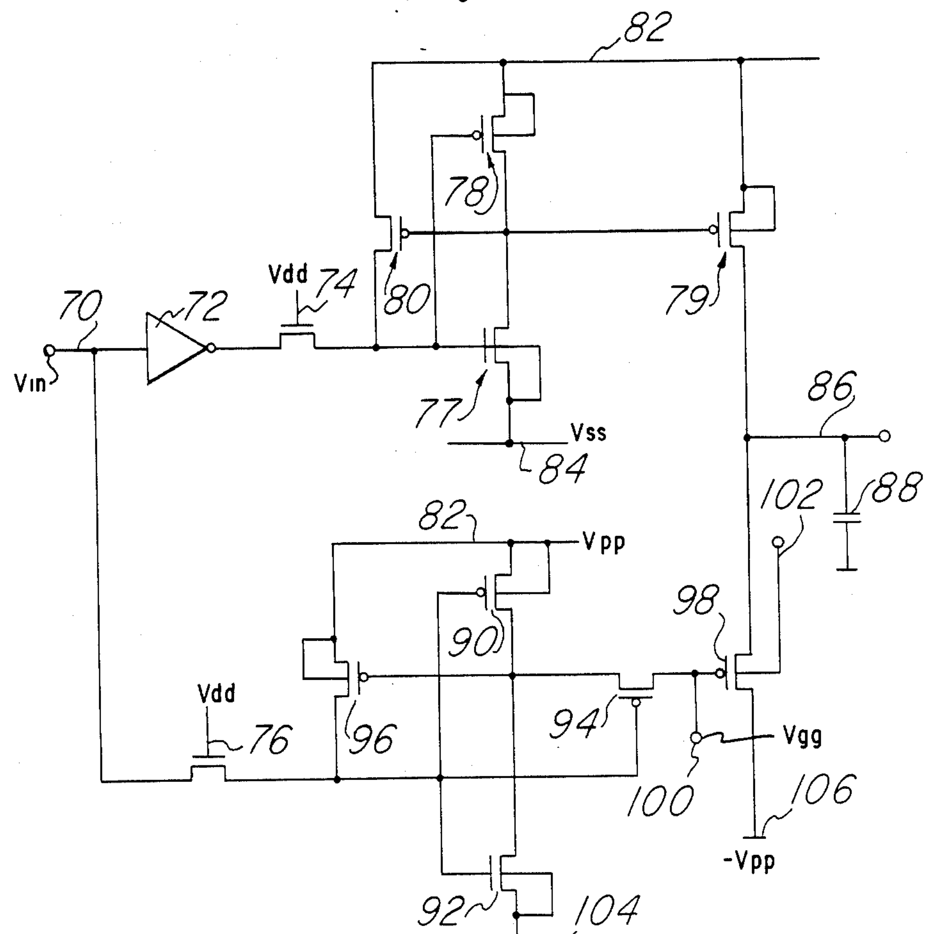
FIG. 16 is a schematic diagram of a circuit for driving each word line of an array.

The circuitry required to drive the cells is indicated by FIGS. 15 and 16. FIG. 15 shows in block diagram form the circuit required to produce the bipolar voltage levels required while FIG. 16 shows a switching circuit required for a particular mode of operation.

In FIG. 15 a single voltage source of say 5 volts is used as input along line 55 with line 59 being ground or substrate voltage. Three charge pumps 57, 56 and 58 the design of which are well known in the art are coupled in parallel across lines 55 and 59. Each charge pump 57, 56 and 58 produces output voltages −Vgg, −Vpp and +Vpp associated output lines 64, 62 and 60, respectively.

The circuit of FIG. 16 functions in response to input control signals received on input line 70 which are fed in parallel to an inverter 72 and through the source to drain path of a field effect transistor 76 whose gate is at Vdd or +5 volts. The inverter 72 output passes through a field effect transistor 74 whose gate is at Vdd or +5 v. The output from transistor 74 couples in parallel to gates of n-channel transistor 77 and p-channel field effect transistors 78 and to drain of P-channel transistor 80. The source of transistor 80 connects to Vpp line 82 and its gate connects to the drain of transistor 77. The source of transistor 77 connects to ground or Vss line 84 while that of transistor 78 connects to Vpp line 82.

The output from transistor 76 couples to the gates of transistor 90, transistor 92 and transistor 94 with transistors 90 and 94 being of the p-channel type. The drain of transistors 90 and 92 couple to a gate of transistor 96 and to a source of transistor 94. The drain of transistor 94 couples both to Vgg line 100 and to a gate of p-channel field effect transistor 98. Transistor 96 has a source connected to Vpp line 82 and a drain connected to an output of transistor 76. The source of transistor 90 connects to Vpp line 82 while that of transistor 92 connects to Vss line 104.

Output high transistor 79 has a source connected to Vpp line 82 and a drain connected to output line 86 while its complementary driver p-channel low transistor 98 has a drain connected to −Vpp line 106 and a source connected to output line 86. Line 86 is charged and discharged by output capacitor 88 connected to Vss.

In operation a "0" voltage input on input line 70 results in a positive signal at the output of inverter 72 which is applied to the gates of transistors 77 and 78. In response transistor 77 turns on grounding the gates of transistors 79 and 80 and turning on both of the latter. Thus, transistor 79 in turning on connects Vpp line 82 to output line 86. The charge pump 58 is operative to charge capacitor 88 to +Vpp. Simultaneously, transistor 80 couples Vpp line 82 to the gates of transistors 77 and 78 thereby maintaining transistor 77 in an ON state and ensuring that there is no voltage across the source/-gate of transistor 78 so that the latter is cut off. Transistor 74 blocks the transmission of Vpp to output of inverter 72. Thus, capacitor 88 is charged through the channel resistance transistor 79 to Vpp.

A "0" output applied through transistor 76 turns on transistors 90 and 94 coupling +Vpp on line 82 to the gate of transistor 98 and maintaining the latter OFF.

With an input signal at 1, inverter 72 applies a 0 signal to gates of transistors 77 and 78 turning on transistor 78 and applying Vpp on line 82 to the gate of transistor 79. Transistor 79 is thus turned and/or maintained OFF.

An input signal at 1 turns on transistor 92 which applies 0 volts to the source of transistor 94 and maintains the latter off. The −Vgg and −Vpp charge pumps 57 and 56 are then activated and transistor 98 turns on charging line 86 towards −Vpp. At the same time the Vpp line 82 is tied to Vdd line 50.

Clearly, a variety of different voltages could be produced by the circuit of FIG. 15 depending upon the requirements. For the cells of FIG. 3 the combination +14 V, −7 V and 2.0 v, 0 v, and −2 v would be appropriate for the row line, and 7 v and 0 v for the bit or read line.

While this invention has been described with reference to an illustrative embodiment, this description is not intended to be construed in a limiting sense. Various modifications of the illustrative embodiment, as well as other embodiments of the invention will be obvious to those skilled in the art upon reference to this description. It is, therefore, contemplated that the appended claims will cover any such modification or embodiments as fall within the true scope of the invention.

What is claimed is:

1. An electrically erasable programmable memory comprising:

a plurality of memory cells each comprising:

a floating gate transistor having a floating gate, and having a control gate connected to a word line; and a row transistor having its gate connected to a row line;

wherein the source-to-drain paths of said floating gate transistor and said row transistor transistor are connected in series between a read line and a column line, so that the floating gate of the floating gate transistor is charged responsive to a voltage applied to its gate which is below the voltage at its source-to-drain path by a predetermined magnitude during such time as said column line floats; and line driving circuitry coupled to said word line for applying a negative voltage to the control gate relative to ground during the ERASE mode such that the application of a voltage to the read line of no greater than the power supply voltage of the memory causes charging of said floating gate.

2. A memory according to claim 1, wherein the negative voltage applied to the control gate by said line driving circuitry in said ERASE mode is of a magnitude such that the voltage difference between said read line and said control gate is equal to the maximum voltage $V_{pp}$ applied to said control gate during the WRITE mode.

3. A memory according to claim 1, wherein the control gate voltage applied by said line driving circuitry is about −12 volts and the read line voltage is about 5 volts during said ERASE mode.

4. A memory according to claim 3, wherein said memory cells are arranged in rows and columns, said memory cells in a row having common word and row lines, said memory cells in a column having common column and read lines, so that the maximum voltage difference between the control gate and the read line for an unselected condition is about 12 volts.

5. A memory according to claim 1, wherein said line driving circuitry includes a plurality of charge pumps for generating auxiliary positive Vpp and negative −Vpp and −Vgg supply voltages from a single voltage source.

6. A memory according to claim 5, wherein said line driving circuitry further includes switching circuits coupled to said charge pumps for selectively coupling output voltages generated by the latter to the control gate and to the switching circuits in response to control signals provided to an input to said switching circuits.

7. A memory according to claim 5, wherein said line driving circuitry includes a push pull circuit comprising:

a first transistor coupled between a $+V_{pp}$ line and an output line, a second transistor coupled between a $-V_{pp}$ line and the output line, a capacitor coupled between the output and ground, and control circuitry controlling the gates of said first and second transistors operative to drive said first transistor ON and said second transistor OFF in response to an input signal $V_{in}$ on an input line being at a first logic state and to drive said said first transistor OFF and said second transistor ON in response to input signal $V_{in}$ being at a second logic state.

8. A memory according to claim 7, wherein said control circuitry includes:

a first driver transistor coupled between the $+V_{pp}$ line and the gate of said first transistor, and a second driver transistor coupled between the gate of the first transistor and the ground line, wherein the gates of both of said first and second driver transistors are coupled through an inverter to said input signal $V_{in}$ such that in response to input signal $V_{in}$ at said first logic state at the inverter input said second driver transistor turns on and in response to input signal $V_{in}$ at said second logic state said first driver transistor turns on;

and wherein said first transistor is p-channel.

9. A memory according to claim 8, wherein said control circuitry further includes:

a blocking transistor, having its source coupled to the gate of said second transistor, a third driver transistor coupled between the $+V_{pp}$ line and the drain of the blocking transistor, and a fourth driver transistor coupled between the drain of said blocking transistor and the ground line, wherein the gates of said third and fourth driver transistors and said blocking transistor are coupled to the input signal $V_{in}$ such that in response to input signal $V_{in}$ at said first logic state, the third driver transistor and said blocking transistor turn ON, and in response to input signal $V_{in}$ at said second logic state said third driver transistor and said fourth driver transistor turn ON and the blocking transistor turns OFF, wherein the gate of said second transistor is coupled to the $-V_{gg}$ outlet of said charge pump and wherein said second transistor is p-channel.

10. A memory according to claim 9, wherein said line driving circuitry further includes:

a first restorer transistor having its source coupled to the $+V_{pp}$ line, its drain coupled to the gates of said first and third driver transistors, and its gate coupled to the gate of said first transistor, a second restorer transistor having its source coupled to the $+V_{pp}$ line, its drain coupled to the gates of said second and fourth driver transistors, and its gate coupled to the drain of said blocking transistor, an isolation transistor coupled between the drain of each of said first and second restorer transistors and said input signal Vin such that in response to said input signal Vin at its first logic state said first restorer transistor turns on and couples the $\pm V_{pp}$ line to the gates of said first and third driver transistors, and in response to said input signal Vin at its second logic state said second restorer transistor turns on and couples the $\pm V_{pp}$ line to the gates of said second and fourth driver transistors and said blocking transistor.

11. A memory according to claim 10, wherein said line driving circuitry further comprises:

a second blocking transistor connected between said inverter and the gates of said first and third driver transistors, and a third blocking transistor connected between the input line and the gates of said second and fourth driver transistors, wherein the gates of said second and third blocking transistors are biased to a voltage sufficient to pass the input signals but not to pass the voltage $V_{pp}$ from said $V_{pp}$ line.

* * * * *